United States Patent [19]

Baldi

[11] Patent Number: 5,077,257

[45] Date of Patent: Dec. 31, 1991

[54] DIFFUSION-COATED METALS

[75] Inventor: Alfonso L. Baldi, Sea Isle City, N.J.

[73] Assignee: Alloy Surfaces Surfaces Company, Inc., Wilmington, Del.

[21] Appl. No.: 472,663

[22] Filed: Jan. 30, 1990

Related U.S. Application Data

[63] Continuation-in-part of Ser. No. 440,026, Nov. 21, 1989, Pat. No. 4,977,036, Ser. No. 433,119, Nov. 8, 1989, Ser. No. 335,240, Apr. 10, 1989, Pat. No. 4,957,421, Ser. No. 289,595, Dec. 22, 1988, Pat. No. 4,965,095, Ser. No. 182,718, Apr. 18, 1988, Pat. No. 4,970,114, Ser. No. 28,741, Mar. 23, 1987, Pat. No. 4,927,798, and Ser. No. 479,211, Mar. 28, 1983, Pat. No. 4,897,375, said Ser. No. 440,026, Ser. No. 433,119, Ser. No. 335,240, and Ser. No. 289,595, each is a continuation-in-part of Ser. No. 205,387, Jun. 10, 1988, Pat. No. 4,895,609, said Ser. No. 433,119, Ser. No. 335,240, Ser. No. 289,595, Ser. No. 182,718, and Ser. No. 205,387, each is a continuation-in-part of Ser. No. 96,368, Sep. 11, 1987, Pat. No. 4,880,483, said Ser. No. 289,595, Ser. No. 182,718, Ser. No. 28,741, Ser. No. 205,387, and Ser. No. 96,368, each is a continuation-in-part of Ser. No. 862,712, May 13, 1986, Pat. No. 4,871,708, Ser. No. 830,767, Feb. 19, 1986, Pat. No. 4,799,979, and Ser. No. 757,606, Jul. 22, 1985, abandoned, said Ser. No. 479,211, Ser. No. 862,712, Ser. No. 830,767, and Ser. No. 757,606.

[51] Int. Cl.$^5$ .................... B01J 25/00; B01J 25/02
[52] U.S. Cl. ................................................ 502/301
[58] Field of Search ....................................... 502/301

[56] References Cited

U.S. PATENT DOCUMENTS 3,425,959  2/1969  Haddad .............................. 502/301

FOREIGN PATENT DOCUMENTS 762961  9/1980  U.S.S.R. ............................. 502/301

Primary Examiner—W. J. Shine
Attorney, Agent, or Firm—Connolly and Hutz

[57] ABSTRACT

Porous metal aluminide catalysts are formed by sintering together a mixture of aluminum powder with a powdered pyrophorically activatable metal in the proportion of about 1½ to 3 atoms of aluminum for every atom of the activatable metal to cause the metal to interact and form a coherent mass, then leaching aluminum out of the mass to render it pyrophoric and then destroying that pyrophoricity.

6 Claims, 2 Drawing Sheets

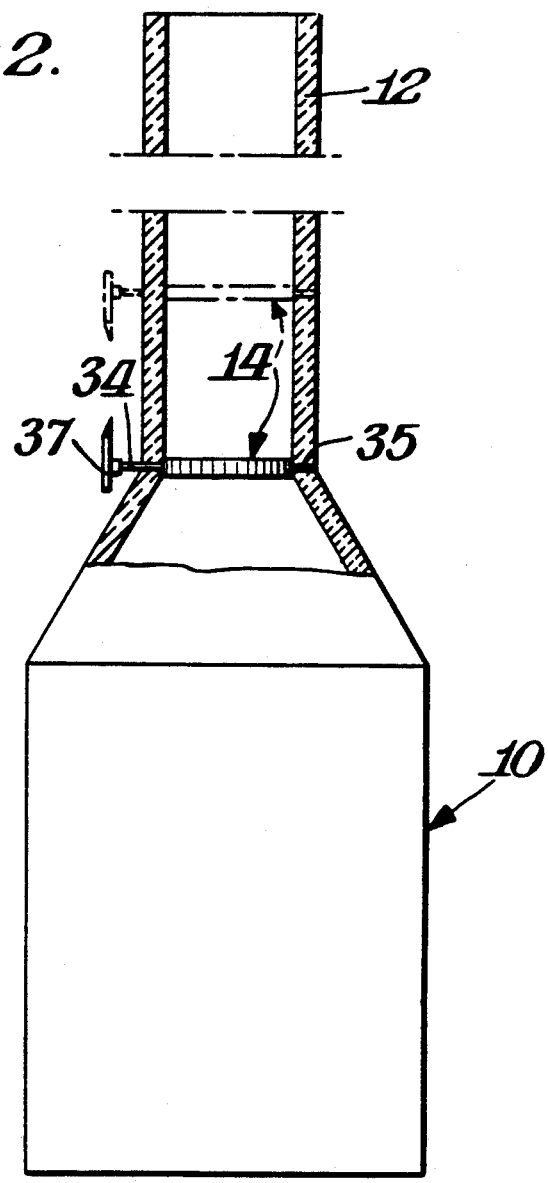
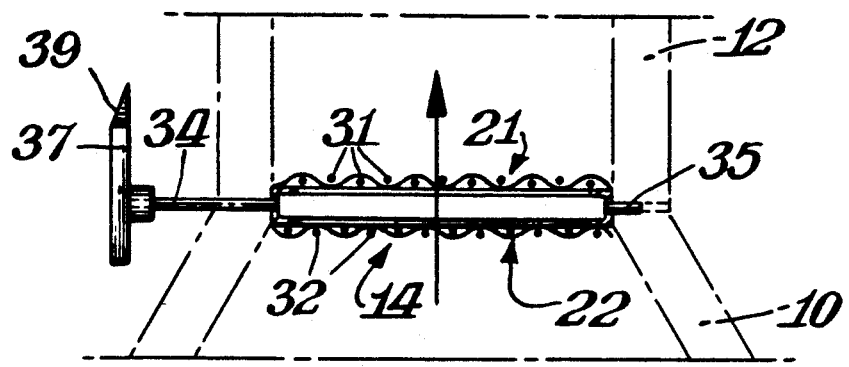

DIFFUSION-COATED METALS

This application is a continuation-in-part of applications:

| Ser. No. | Filing Date |
|---|---|
| 440,026 | Nov. 21, 1989 (U.S. Pat. No. 4,977,036) |
| 433,119 | Nov. 08, 1989 |
| 335,240 | Apr. 10, 1989 (U.S. Pat. No. 4,957,421) |
| 289,595 | Dec. 22, 1988 (U.S. Pat. No. 4,965,095) |
| 182,718 | Apr. 18, 1988 (U.S. Pat. No. 4,970,114) |
| 28,741 | Mar. 23, 1987 (U.S. Pat. No. 4,927,798) |
| 479,211 | Mar. 28, 1983 (U.S. Pat. No. 4,897,375) |

These parent applications are in turn direct or chained continuations-in-part of the following earlier applications:

The '026, '119, '240 and '595 applications are continuations-in-part of earlier application Ser. No. 205,387, filed June 10, 1988 (U.S. Pat. No. 4,895,609).

The '119, '240, '595, '718 and '387 applications are continuations-in-part of earlier application Ser. No. 96,368 filed Sept. 11, 1987 (U.S. Pat. No. 4,880,483).

The '595, '718, '741, '387 and '368 applications are continuations-in-part of earlier application Ser. No. 862,712 filed May 13, 1986 (U.S. Pat. No. 4,871,708), and also continuations-in-part of earlier application Ser. No. 830,767, filed Feb. 19, 1986 (U.S. Pat. No. 4,799,979), as well as of earlier applcation Ser. No. 757,606, filed July 22, 1985 (subsequently abandoned).

The '211, '712, '767 and '606 applications are continuations-in-part of earlier application Ser. No. 605,248, filed Apr. 30, 1984 (subsequently abandoned).

The '211, '712, '767, '606 and '248 applications are continuations-in-part of earlier application Ser. No. 488,103 filed Apr. 25, 1983 (U.S. Pat. No. 4,615,920).

The '211 and '103 applications are continuations-in-part of earlier application Ser. No. 359,212 filed Mar. 18, 1982 (U.S. Pat. No. 4,443,557).

The '211, '103 and '212 applications are continuations-in-part of earlier application Ser. No. 302,979 filed Sept. 17, 1981 (subsequently abandoned).

The '741, '211, '368, '712, '767, '606, '248, '103, '212 and '979 applications are continuations-in-part of earlier application Ser. No. 281,505 filed July 8, 1981 (U.S. Pat. No. 4,708,913).

The '211, '103, '212 and '979 applications are continuations-in-part of earlier application Ser. No. 242,350 filed Mar. 10, 1981 (U.S. Pat. No. 4,464,430).

The '212, '979, '505 and '350 applications are continuations-in-part of earlier application Ser. No. 230,333 filed Feb. 2, 1981 (U.S. Pat. No. 4,347,267).

The '211, '103, '212, '979, '505, '350 and '333 applications are continuations-in-part of earlier application Ser. No. 172,671 filed July 28, 1980 (U.S. Pat. No. 4,435,481).

The '979, '505, '350 and '333 applications are continuations-in-part of earlier application Ser. No. 172,938 filed July 28, 1980 (subsequently abandoned), and of earlier application Ser. No. 98,654 filed Nov. 29, 1979 (U.S. Pat. No. 4,290,391) and also of earlier application Ser. No. 25,456 filed Mar. 30, 1979 (U.S. Pat. No. 4,349,612).

The '671, '938, '654 and '456 applications are continuations-in-part of earlier application Ser. No. 963,313 filed Nov. 24, 1978 (subsequently abandoned) and also of earlier application Ser. No. 752,855 filed Dec. 21, 1976 (U.S. Pat. No. 4,208,453).

The '855 application is a continuation-in-part of earlier application Ser. No. 694,951 filed June 11, 1976 (subsequently abandoned).

The '313, '855 and '951 applications are continuations-in-part of earlier application Ser. No. 614,834 filed Sept. 19, 1975 (U.S. Pat. No. 4,141,760).

The present application is directed to metals that are activated to make them particularly effective for catalytic and other purposes.

Among the objects of the present invention is the provision of improved catalytic operations.

The foregoing as well as other objects of the present invention will be more fully understood from the following description of several of its exemplifications, reference being made to the accompanying drawings.

BRIEF DESCRIPTION OF THE DRAWINGS

FIG. 2 is a front view, partly in section of a flue that incorporates one aspect of the present invention; and FIG. 3 is an enlarged detailed view with parts broken away of the catalyst shown in FIG. 2;

Figure 1:
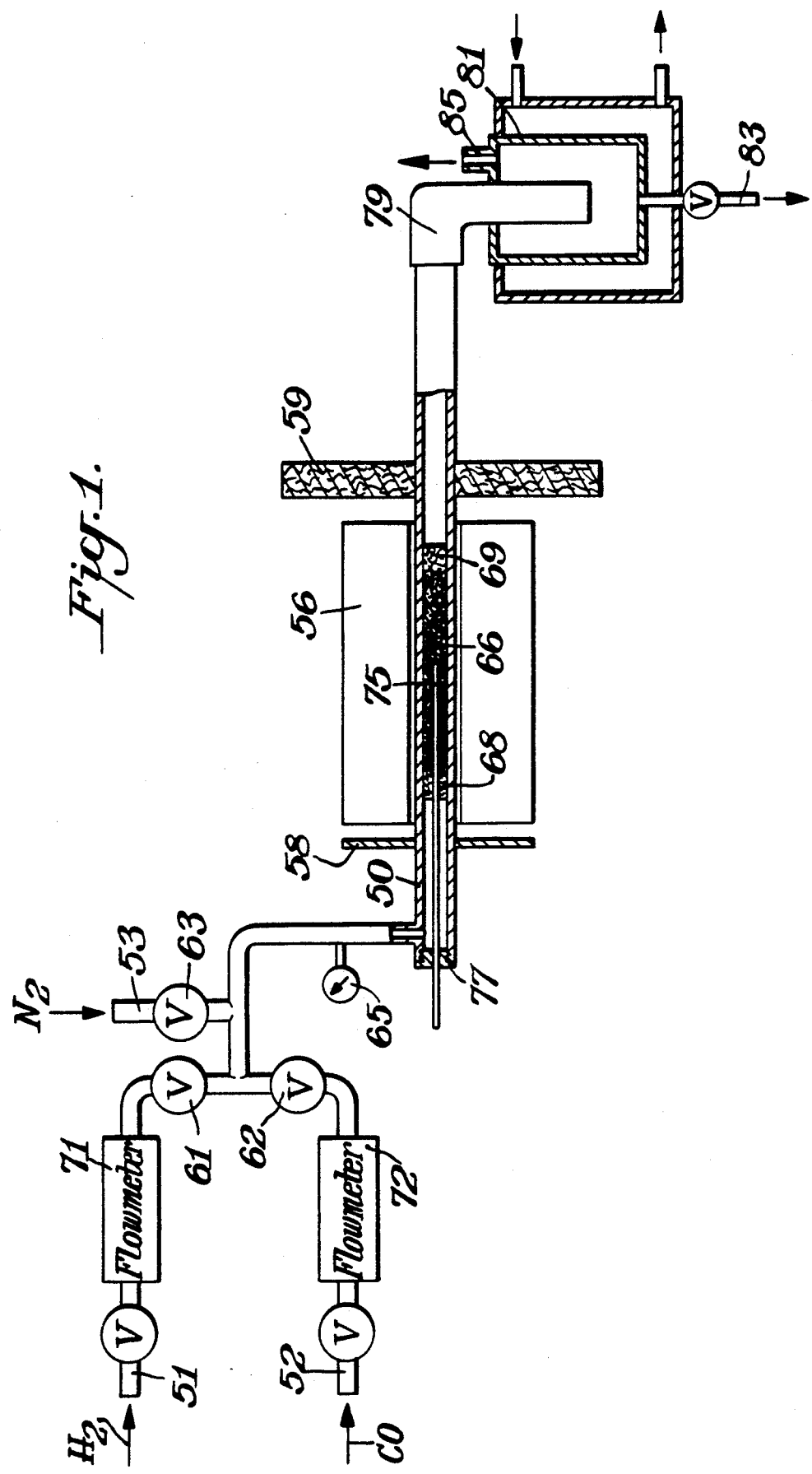
FIG. 1 is a diagrammatic representation of a methanation apparatus using a catalyst of the present invention.

As noted in some of the parent applications, many metallic catalysts show improved catalytic activity when they are activated by the technique illustrated in the examples set out in U.S. Pat. No. 4,154,705. Such technique involves the low-temperature diffusion into the surface of the catalytic metal of a different metal which is subsequently leached out. The leachable metal is generally aluminum or zinc.

According to the present invention, catalytic brass such as that used in commercial methanol formation, is made more active by diffusing aluminum into its surface to bring its aluminum content to at least about 17% by weight, and then subjecting that surface to the leaching action of aqueous mineral acid to leach out a substantial amount of its zinc, along with much of the added aluminum. The leaching is best conducted hot, with acid not stronger than about 5% by weight, and stopped when the surface of the brass becomes dark brown, showing that essentially all of the aluminum and zinc in the skin has been dissolved. If not deliberately stopped, the leaching will continue for several hours gradually slowing down to practically a standstill. At that point, no significant amount of copper has gone into the solution, and the solution is still colorless even when the leaching acid is nitric acid. Equivalent leaching can be effected with cold acid as strong as about 10% by weight. At any stage after is first turns brown, the leached product is highly catalytic.

The resulting activated material causes very rapid decomposition of $H_2O_2$ when dropped into a 30 weight percent aqueous solution of that material, and when made from a brass containing 10 to 40 weight percent zinc is also a good catalyst for methanol production from CO and $H_2$.

In one embodiment the catalyst of the present invention is a non-pyrophoric porous sintered in situ formed metal aluminide catalyst which has been activated by leaching out much of the aluminum in the aluminide. The catalyst may be placed on a carrier support and is preferably nickel aluminide or iron aluminide. The catalyst suitable is also aluminides of a denitration metal.

FIG. 1 illustrates a typical small-scale methanol synthesis setup for the above purposes. A high-pressure reactor tube 50 is connected to receive pressurized streams of $H_2$, CO and $N_2$ from branched inlets 51, 52 and 53, respectively. Valves 61, 62 and 63 are contained in the respective branch supply lines; flowmeters 71 and 72 are inserted into branch inlets 51 and 52 to measure the flow of $H_2$ and CO. A pressure gauge 65 is preferably provided at or near the reactor tube inlet.

A tube-type electric furnace 56 is fitted over the reactor tube 50, and thermal shields 58 and 59 placed at both ends of the furnace to help keep the remainder of the equipment from becoming excessively heated. A roll of catalytic screening 66 is inserted into a portion of the reactor tube within the furnace confines and is held there with the help of glass wool plugs 68 and 69 which are wedged into place. Plug 68 is penetrated by the screening end 75 of a thermocouple that extends into the screening 66 and is connected through a threaded cap 77 to an external thermocouple meter.

Reactor tube 50 is preferably a straight length so the catalyst can be easily inserted and removed. A threaded-on exit trap tube 79 can be fitted to the downstream end of the reactor tube to lead the fluids formed in the reactor tube into a jacketed cooling trap 81 where condensible fluids are collected and discharged through valved exit 83. Non-condensing fluids leave through gas outlet 85 and can be re-circulated back to one of the illustrated inlet branches or to a separate inlet branch. The re-circulated fluids can be subjected to a purification treatment before they are returned to the reactor inlet. Alternatively, those fluids can be merely vented off.

The apparatus of FIG. 1 is put into use by first assembling it with the catalyst in place, purging its interior with nitrogen by opening valves 63 and 83 while valves 61 and 62 are kept closed, then starting the oven 56 and very gradually opening hydrogen valve 61 while closing valve 63 to bring the pressure to about 1500 psig. When the thermocouple reaches about 200° C., valve 62 is opened to introduce the pressurized CO. Where the catalyst has a heavily oxided surface, as for example because of a prior treatment with $H_2O_2$ or heating in air, the introduction of the CO is preferably delayed an hour or two to make sure any copper oxide is reduced to copper. The CO introduction causes the catalyst temperature to increase as a result of the methanol-forming reaction $CO + 2H_2 \rightarrow CH_3OH$, which reaction generates considerable heat. The oven can then be generally turned down or turned completely off, and the reaction controlled by adjustments of valves 61 and 62 to keep the catalyst temperature between about 200° C. and 450° C.

It is generally desirable to introduce the hydrogen into the reactor inlet in a proportion of somewhat more than two volumes for each volume of CO. This provides a stoichiometric excess of hydrogen which can be recycled along with unreacted CO.

Instead of supplying pure CO to inlet 52, commercial products such as synthesis gas can be used even though they contain some $CO_2$ and other ingredients. In the reactor tube any $CO_2$ present will be at least partially reduced to CO by the hydrogen. This causes water to form with the methanol that is produced. The progress of the methanation can be followed by bleeding part of the fluids emerging from outlet 85 to a gas chromatograph or the like that measures its CO and $CH_4$ contents. Too much $CH_4$ indicates the reaction temperature is too high. Too much CO indicates the reaction temperature is too low or the catalyst has been poisoned.

The following catalyst is suitable for the foregoing use:

EXAMPLE 1

An 80 by 80 mesh screen of 80:20 brass wire 5.5 mils thick is cleaned, dried and packed in aluminizing powder contained in a diffusion coating retort as described for platinum screens in Example XII of U.S. Pat. No. 4,154,705. Diffusion is conducted at 900° F. for ten hours as described in the patent's example, yielding a product with an off-white appearance that had a weight gain of about 4 milligrams per square centimeter of screen as measured with a ruler. That weight gain represented aluminum that had diffused into the surface of the screen wires to a depth of about 1.5 mils. The outermost skin of the aluminized case had an aluminum content of about 21%.

The aluminized screen was cleaned and then dropped into an excess of a hot (180° F. to 200° F.) solution of 2% $HNO_3$ in water. Bubbling commenced, showing that the screen was being attached by the acid. After about one-half hour the bubbling slowed very sharply and the surface of the screen appeared dark brown rather than off-white. The resulting screen was then removed from the acid which was still colorless, washed, dried and weighed. It showed a weight loss of 8.69 milligrams per square centimeter, based on the weight of the aluminized screen. A test with cold 30% $H_2O_2$ showed vigorous $H_2O_2$ decomposition.

A 100 by 100 mesh screen of 80:20 brass wire 4.5 mils thick, aluminized at 850° F. for twelve hours and then leached with hot 1.5% $HNO_3$ gives very good methanol formation at 780° F. and 1500° psig from a stream of 80% to 85% hydrogen, 7% $CO_2$—the balance CO. Such an activated screen rolled up from a strip 1½ inches wide to make a tube having a 0.7 centimeter internal diameter and a 1.5 centimeter outer diameter that fits snugly into reactor tube 50 enables methanol formation with a space velocity of 50,000 per hour.

Instead of having the catalyst in the form of a screen, it can be made into the form of a sheet or tube. A tube of this kind can be used as the reactor for the methanol formation. A sheet of 70:30 brass 30 mils thick, subjected to the activation described in the foregoing Example 1, but with the diffusion coating temperature 50° F. higher, showed an aluminizing weight gain of 5.4 milligrams per square centimeter and a leached weight loss of 9.75 milligrams per square centimeter, in 1.5 weight % $HNO_3$ in water. Its surface skin after aluminizing had an aluminum content even higher than that of the aluminized screen of Example 1. This sheet catalyst was also vigorously active against $H_2O_2$.

The catalyst can be impregnated with chromium oxide after leaching, as by momentarily dipping the leached material into an aqueous solution of chromic acid or ammonium chromate or dichromate and then heating the dipped product to drive off the water. A solution having at least 10% by weight $CrO_3$ is preferred for the dipping. When such an impregnated catalyst is subjected to the action of hydrogen at elevated temperatures, some of the chromium oxide is reduced to lower oxides and to metallic chromium. A chromium nitrate dip followed by drying at elevated temperatures, is also helpful.

Brasses that contain a few percent silicon, tin and/or manganese such as Admiralty brass, manganese brass and manganese bronze, can be substituted for the foregoing brasses.

Zinc-free copper and bronzes such as phosphor bronze which contains up to about 10% tin can also be activated by the foregoing aluminizing and leaching sequence, although here the weight loss on leaching is less than the weight gain on aluminizing. Copper activated in this way is also catalytic and causes vigorous decomposition of 30% $H_2O_2$.

The leaching acids of the present invention do not give adequate attack at low temperatures—below about 100° F. They also show very little attack on untreated copper or untreated brass or on aluminum at elevated temperatures. The leaching action is accordingly considered as depending upon the electrolytic relationship between the aluminum and the copper or the aluminum and the zinc, in the aluminized metals. An aluminum content in the surface skin after diffusion aluminizing should not be over about 35% to 40% by weight.

Temperatures as low as about 625° F. can be used for effective aluminizing, but the diffusion times should then be at least about 20 hours.

Such diffusion-aluminized brasses, bronzes and copper, are attacked by strong aqueous NaOii. Thus, 20% by weight aqueous caustic soda will even at room temperature as well as at temperatures as high as 210° F., cause bubble formation when contacted by any of the foregoing aluminized materials. Although this bubble formation shows that something is being attacked, the aluminized surfaces after an hour of such attack do not turn dark brown and show very little catalytic action as determined by their effect on $H_2O_2$. The preference for caustic leach expressed by L. Faucounau in Bull. Soc. Chim. Fr. 1937—pp. 58-62, and the drop in catalytic activity suggested in British Patent Specification No. 1,170,698 for simple acid leaching is apparently not applicable. A preference for acid leaching of platinum-copper alloys is indicated in U.S. Pat. No. 2,384,501.

For use as a reactor tube, 73:27 brass pipe, having an outside diameter of 0.675 inch and a wall thickness of about 0.25 inch, is diffusion aluminized on its internal surface, using a fluent diffusion coating pack and capping the pipe ends as described in U.S. Pat. No. 4,327,134. The aluminum content of the pack is 30weight %, the content of energizer ($AlCl_3$) ¾ weight %, and the diffusion time is extended to sixteen hours.

After aluminizing the internal skin of the pipe has over 20% aluminum, and is leached with aqueous 3.5 weight % $HNO_3$. It is then rinsed, cleaned, and used for the reactor tube 50 of FIG. 1. A feature of such use is that the excellent thermal conductivity of such a pipe greatly improves the temperature control of the methanol-forming reaction. The large amounts of heat generated by the methanol formation is so rapidly carried away that the throughput rate of reacting gases can be significantly increased. Inasmuch as such a pipe has a substantial internal diameter, high throughputs are best obtained when the pipe's interior is at least about five to ten inches long so that its catalytic surface is correspondingly enlarged.

A similar but smaller thermal conductivity can be obtained with activated sheet brass catalysts rolled into cylindrical configuration and inserted in coaxial relation in the interior of a separate metal reactor tube in which they are closely fitted. Only the internal faces of the cylindrically curved brass sheets are activated, and the activation can be effected before or after the sheets are cylindrically shaped.

Heat control with the brass or metal reactor pipe is also facilitated by fitting such a pipe with an encircling heat-exchange jacket and circulating a heat-exchange liquid through the jacket. Such a circulating liquid, a silicone oil, for example, can be externally heated and passed hot through the heat exchanger to heat up the reactor tube for starting up the reaction. When the reaction gets under way, the heat exchange liquid can be externally cooled before it is introduced into the heat-exchange jacket. Because the active catalyst surface in the foregoing constructions is in very good thermally conductive contact with the outside of the reactor tube, the liquid in the heat-exchange jacket does a good job of heating and cooling that surface, even when the catalyst is an activated rolled-up screen or a piece of activated brass wool or sponge, tightly fitted inside the reactor tube.

It is also possible to effect good heat control by conducting the methanol-forming reaction in a liquid phase, as by bubbling the reactants through a body of liquid cyclohexanol in contact with the cupreous catalysts of the present invention. The liquid provides good heat exchange contact with the walls of the container in which the liquid is held and those walls can be part of a heat-exchanger.

Very good catalytic activity is also obtained when the zinc content on the surface skin of the catalyst is kept up at a level of at least about 1% to 10% by weight. This is readily effected by adding metallic zinc to the pack in which the aluminum diffusion is performed. As little as one part zinc to ten parts aluminum by weight in the pack provides a significant increase, but as much as 40 to 50 parts zinc per 100 parts aluminum by weight can be used. High zinc concentrations in the pack tend to keep the brass from turning brown when leached. The leaching is then best controlled by timing. Generally, a half-hour dilute acid leach at 170° F. or higher is very effective, but as little as ten minutes at those temperatures provides good results.

Hydrochloric acid, sulfuric acid and phosphoric acid also accomplish the activation of the brass, but they leave some residual anions that appear to stubbornly resist rinsing operations. Such residual chloride or sulfate ions can have an adverse effect on methanol formation, whereas residual nitrate ions appear to have no significant deleterious effect. If desired, however, the activated brass surface can be heated to about 250° C. to decompose residual nitrate before preparing the equipment for the methanol formation.

Acetic acid does not significantly leach anything from the aluminized brass. It can be added to any of the above-noted mineral acid leaching solutions in amounts as high as twenty times that of the mineral acid without noticeably modifying the leaching action.

Aqueous ammonium persulfate solutions in strengths of from about 3% to about 10% by weight also do a good job of leaching the brass catalysts of the present invention, particularly when the solutions are at temperatures above about 80° C. However, ammonium persulfate has a strong tendency to also leach out some copper after the activated surface turns dark brown. It is best to watch the leaching after the first five minutes so it can be terminated before a significant amount of copper is leached out. Stronger and even saturated solutions of ammonium per sulfate can also be used but have to be watched more closely, particularly when they are used hot. A hot water solution of picric acid is also an effective leaching agent.

The activated brasses of the present invention become noticeably pyrophoric when heated to about 300°

F. if the activated surface layer is at least about 0.2 mil thick. Such an activated brass in which the non-activated thickness is not over about ten times that of the activated layer has a pyrophoric activity sufficiently strong to heat the brass to red heat.

The foregoing activation of brass can also be used to activate other catalysts such as the nickel-cobalt-molybdenum catalyst used for the hydrogen-reduction of CO to methane. It is particularly effective when a caustic leach is used in place of the acid leach, for activating stainless steel catalysts used with $NH_3$ or other reducing gases to reduce the NOX content of furnace stack gases where the furnace is fired with coal or oil. A stainless steel catalyst for the above purpose is in the form of a metal wire screening in which the spacings between the screen wires define passageways about 30 to about 200 mils wide. The wires themselves can have a thickness from about 5 to about 30 mils.

Such screening can very conveniently span across a flue passage so that all the flue gases pass in intimate contact with the screen wires and there is minimum obstruction to gas flow. It is generally desirable to provide a stack or series of screens in the flue, particularly where the gas velocity is high, to assure adequate contact of the moving gases with the activated catalyst.

Such a screen arrangement packs a great deal of active catalyst surface in a modest space, and will not trap too many particulates that may be carried by the gas. Thus by making the openings between screen wires about 100 mils or greater, the passage of ash particles and even some carbon flakes, is not seriously obstructed. Where a stack of two or more screens is used, the adjacent screens can be spaced a little from each other, to minimize the trapping of particulates. Also with spacings of at least about 100 mils between adjacent wires, it is helpful to have pairs of screens with one screen of the pair offset from the other by about half that spacing. This helps assure that all portions of the moving gas came sufficiently close to the active catalyst surfaces.

Another feature of the use of screens, is that a screen or a pair or stack of screens can be held in place in a manner that permits turning upside-down, so that particulates trapped against the bottom of a screen by upwardly flowing flue gas can be blown off by the gas when the screen is upside-down. The catalytic screens can be generally flat members hanging vertically in the path of a laterally moving stream or a vertically moving stream of flue gases. Horizontally positioned screens can also be mounted in the path of a horizontally moving flue gas stream.

An iron-base alloy containing by weight at least about 10% chromium, preferably at least about 15% chromium provides very effective catalyst surfaces. Although pure iron or low carbon steel can be used, their catalytic efficiency is lower. The catalytic surface can contain as much as 20% aluminum by weight inasmuch as not all the diffused-in aluminum need be removed. It is preferred to only remove about 30% to 60% of the diffused-in aluminum. Energized pack diffusion will form very good diffusion cases at the crossover points of screens, where crossing wires contact each other. Thus a type 410 stainless steel wire screen is easily diffusion coated to form an aluminized case about 2 mils thick with the case thickness variations within plus or minus 10%. Upon leaching with aqueous caustic the resulting activated surface is more efficient than the activated layers described in U.S. Pat. Nos. 4,040,981 and 4,206,081. A diffusion case 1.5 mils thick gives even better results.

Pack or vapor diffusion is also a convenient technique for introducing the chromium into an iron or steel to provide the surface alloy into which the aluminum is to be diffused. Vanadium, manganese, tungsten, molybdenum, copper, titanium and tin can likewise be introduced into an iron substrate by such techniques, with or without the chromium, to also improve the catalytic action obtained after activation by the aluminum diffusion and subsequent leaching. Alternatively any or all of these adjunct metals can merely be plated on the iron substrate so that they diffuse into it during the aluminum diffusion.

EXAMPLE 2

A 20-mesh screen of 16 mil thick type 430 stainless steel wire was embedded in a powder pack of 20% by weight 10 micron aluminum and 80% by weight 325 mesh alumina, with $\frac{1}{2}$% by weight $AlCl_3$ added to the pack as energizer. Diffusion was effected in a hydrogen-blanketed atmosphere at 950° F. to 1000° F. for 20 hours, as described in U.S. Pat. No. 3,764,371, after which the coated screen was dropped into aqueous 16% to 20% NaOH where it was reacted for 2 hours. The screen so leached was then rinsed off and shows an active microporous layer about 1.3 mils thick. It is ready for the denitrations described in U.S. Pat. No. 4,040,981 or if desired for the pre-denitration treatments described in that patent as well as in U.S. Pat. No. 4,206,081.

Other chromium-containing iron-base alloys can be similarly treated. Alloys containing more than about 50% chromium by weight are not preferred. Austenitic, martensitic and ferritic stainless steels are suitable base materials.

Instead of starting by aluminizing stainless steel screening, screening of ordinary low carbon steel such as type 1010 can first be chromized, using either a pack diffusion as in Example 1, or a gaseous diffusion as in U.S. Pat. No. 3,222,212 or in parent U.S. Pat. No. 4,290,931. These as well as other techniques for chromizing as well as for applying molybdenum, vanadium, titanium, copper and tungsten, as well as their carbides, nitrides, borides and silicides are described in the text Vapor Plating by C. F. Powell, C. E. Campbell and B. W. Gonser, Copyright 1955 by John Wiley & Sons, Inc. Decarburizing a steel makes it more suitable for chromizing.

As with chromium, it is preferred that the coated surface of the iron substrate contain at least 10% and not more than 50% of the molybdenum, manganese, vanadium, titanium, copper, tungsten or tin, or of combinations of these metals with or without the chromium. This concentration is only needed in the outermost one or two mils of the iron surface. During the subsequent aluminizing and leaching to activate the surface, the activated case that is formed has about two to four times the thickness of the metal depth from which it is formed. Accordingly, a one-mil penetration of chromium or vanadium, for example, will be expanded to over two mils in the activated product. As little as 5% of these alloying metals can be used.

The expanded surface is quite porous and also contains added aluminum, and as much as about 40% of the aluminum that is diffused in, can remain after the leaching operation. A vigorous leaching also loosens and removes most, if not all of the very porous layer of stainless steel that is formed during the initial portion of the leaching, particularly if that porous layer is thicker than 1.5 to 2 mils. Notwithstanding such loosening the resulting stainless steel is a very active NOX-reducing catalyst although its life might be shortened.

The content of chromium or vanadium or other adjuvant in the metal surface after mild leaching is only about 8/10 to 9/10 its content before activation. After vigorous leaching that removes the porous layer, the fraction drops to 5/10 or less.

Where the adjuvant metal is applied as a top plating to the iron substrate for subsequent diffusion into the iron surface, sufficient plating should be applied to obtain a subsequent penetration of at least about 0.5 mil before aluminizing, or 1 mil after aluminizing. Lesser penetrations are not as desirable, and diminish the NOX-reducing effect.

While tin can be applied to the catalytic surfaces of the present invention by any of the techniques described above, it can also be applied by having tin present in the leaching solution as described in parent U.S. Pat. No. 4,435,481. Thus dissolving 5 to 10 grams of $SnCl_2.2H_2O$ in a solution of 50 grams NaOH in 500 cc. water provides a good leach solution that leaves the leached catalyst somewhat more active than a corresponding leach solution not containing the tin.

Instead of aluminum, zinc can be used as the activating metal diffused into the iron or iron alloy substrate. It diffuses in more rapidly than aluminum so that diffusion times can be reduced about 25% and diffusion temperatures reduced about 50° F.

EXAMPLE 3

An 8-mesh screen woven from 10-mil thick 1010 steel wire is given a vanadizing treatment at 1000° C. in a stream of hydrogen and HCl that has been passed over vanadium as described on page 39 of the Powell et al text and the references cited therein, to form a one-mil thick case.

The resulting screen is then embedded in a powder pack consisting of 15% by weight zinc powder and 85% by weight powdered alumina, to which pack ½% by weight of anhydrous zinc chloride is added. Diffusion is then conducted as in Example 2 to cause the screen to pick up about 27 milligrams of zinc per square centimeter of gross wire surface. The zincized screen is then subjected to 20% aqueous NaOH for 30 minutes, rinsed and dried, and shows an active surface layer about 2.5 mils thick. This makes a very effective denitrating catalyst with or without any of the other pre-denitrating treatments of U.S. Pat. Nos. 4,040,981 and 4,206,081.

FIG. 2 of the drawings shows the exterior of an oil-fired furnace 10 having a stack 12 partly broken away to show its interior. At the base of the stack is fitted a frame 14 holding a pair of screens 21, 22 as indicated in FIG. 2. The frame is fitted to hold the screens so that they extend across essentially the entire cross-section of the stack. The screens have their wires 31, 32 offset and a corresponding offset for their cross wires.

Frame 14 is rotatably mounted in the stack by means of pivot extensions 34, 35, and one of these extensions carries a handle 37 by which the frame can be rotated around the horizontal axis defined by the extensions. The handle also has a pointed end 39 that indicates the rotary position of the frame.

When desired, as for example when the flow of stack gases becomes excessively impeded because particulates have accumulated on the lower face of the lower screen, the frame is rotated 180°. This permits the flue gases in their upward movement to blow the accumulated particulates off that face.

Instead of rotating frame 14, it can be fitted into a groove extending around the interior of the furnace walls and penetrating completely through one wall. The frame can then be slid into position through that penetrating groove. So positioned it can then be easily removed when desired and replaced in upside-down position. Sonic or ultrasonic vibrators may be connected to the frames to delay trapping and expedite freeing of particulates. Such vibration can also be separately used to help clean a particulate-coated frame that is removed from the stack and immersed into a cleaning bath.

Two screens are generally not enough for most stack denitrations, and additional sets of screens can be used as indicated in FIG. 2. Also three or more screens can be fitted on a single frame. Spacing one screen from its adjacent screen by a distance at least as large as the widths of the screen openings, helps reduce the trapping of particulates on the screens. Although the screen wires are shown as round in cross-sections, these cross-sections can alternatively be square, rectangular, oval, or of any other configuration.

The screens of the present invention will reduce the nitrogen oxide content of stack gases even when little or no ammonia is present, but it is helpful to add a small amount of ammonia where not enough is present to permit the stoichiometric reaction, e.g.:

$$6NO + 4NH_3 \rightarrow 5N_2 + 6H_2O$$

Carbon monoxide also helps the screens of the present invention reduce nitrogen oxides to nitrogen whether or not ammonia is present, and carbon monoxide is normally present in significant concentrations in combustion gases. Thus coal-fired furnaces show very little ammonia content in their flue gases, but their carbon monoxide output can be greater than their nitrogen oxide output.

The stack catalysts of the present invention show their greatest effectiveness at temperatures of about 600° F. or somewhat higher. It is accordingly preferred for the screens to be positioned where the stack gases have these temperatures. When the stack gases contacting these screens are at relatively low temperature, the catalytic efficiency of the screens can be increased by heating them, as by means of a small auxiliary burner mounted under them or by passing an electric current through them.

The catalytic iron and steels are pyrophoric when the leaching of the aluminum or zinc is completed. A little aluminum or zinc remains in the substrate at that point. If the iron or steel contains chromium, the pyrophoricity that is obtained decreases as the chromium content increases.

Pyrophoric action can be blocked for a few days by keeping the pyrophoric surface covered with leach solution or even plain water. Triethanolamine also protects such a surface if applied as a layer at least about 0.3 mil thick, and such protection can be maintained for long periods of time. Such a triethanolamine coating is also highly effective for protecting stored iron surfaces against corrosion caused by exposure to the atmosphere. Even chromized iron and chromized low alloy steels are very effectively protected against atmospheric corrosion by the triethanolamine coating.

To demonstrate such protection, chromized low alloy steel boiler tubing which withstands attack by high-temperature high-pressure steam for many years, will if stored unprotected outdoors or even in a shop atmosphere for a few weeks develop pit type corrosion that can become quite serious. Such corrosion as well as the corrosion of chromized or unchromized iron screens, is completely prevented by a triethanolamine coating.

Any triethanolamine or other protective coating can be readily removed from the screens of the present invention so that they can be installed as catalysts or be given further treatment to complete the development of the maximum catalytic effectiveness. Where the screen is pyrophoric, it is preferably first exposed to a low partial pressure of oxygen, as by placing it in a storage box whose interior is supplied with a mixture of air and argon in a 1:2 proportion by volume. A screen wet with volatile rinsing liquid will then dry out and a few minutes later will have completed whatever pyrophoric reaction it is capable of. The screen may still be capable of further pyrophoric action when exposed to the normal atmosphere or to high-oxygen-content atmospheres, but such further action is generally quite minor.

The activation treatment of the present invention can be conducted with portions of the catalyst web masked so that no diffusion takes place at those portions. Thus the outer surface of the brass pipe for the construction of FIG. 1 can be so masked using masking compositions analogous to those shown in the prior applications. Such composition can also be applied in the form of pastes that do not flow and can be squeezed out of a syringe or collapsible tube like toothpaste. Thus into a solution of 9 grams of acrylate resin such as poly(ethylmethacrylate) in 100 cc methyl chloroform is stirred 2 grams of colloidal silica particles having a surface area of about 200 square meters per gram. 100 grams of a mixture of finely divided brass and powdered alumina, in a 1:2 weight proportion is then stirred into the resulting thickened solution to form a paste that can be dispensed from a syringe fitted with a No. 13 needle having an internal bore about 60 mils in diameter. The brass should have a composition approximating that of the pipe.

The paste is dispensed directly onto the workpiece surface to be masked and remains in place. Accurate boundaries for a masked area of any contour are easily followed by such a technique. Moreover, the desired amount of masking mixture can be applied as a single layer of paste that can be as much as 60 mils thick, so that multiple dipping as described in Ser. No. 242,350, now U.S. Pat. No. 4,464,430, is not needed. Even thicker layers can be applied by using needles with larger bores, or by extruding the paste through a toothpaste tube. In general a paste thickness of at least about 10 mils is preferred.

Where two or more layers of different masking compositions are used one above another, as described in parent U.S. Pat. No. 4,464,430, corresponding layers of suitably formulated paste can be used. Thus the foregoing powdered brass masking layer can be covered by a layer of Ni$_3$Al or nickel, with or without a refractory diluent such as alumina.

The extruded pastes lose much of their volatile solvent on standing a few minutes, and this evaporation changes the pastes to very hard layers that withstand the mechanical treatment needed to embed the masked workpieces in a diffusion coating pack. For this purpose at least about 95% of the liquid content of a paste should be volatilizable within about 5 minutes after the paste is extruded.

Other thickening agents can be used, as well as other solvents and other resins, to make the pastes. To make an article of commerce the pastes are desirably formulated with the masking powder in one container, and the balance of the paste in another, so that the purchaser can mix them together fresh for use. A pre-mixed masking-powder-containing paste can be subject to settling over very long periods of time inasmuch as some of the powder is a metal of high specific gravity.

Masking can also be used to localize the top coating of metals like titanium that are to be protected as by aluminizing, boronizing, nitriding or the like. Thus pack formulations can be applied to those localized areas to prevent coating. For this purpose the titanium content in the pack should be at least about 35% to assure the desired masking effect, and the thickness of the masking layer at least about 3 millimeters. For best results the masking formulation should contain about 43% titanium diluted with an inert powder such as alumina or kaolin or magnesia. Inasmuch as such high titanium concentrations can cause alloying ingredients in the workpiece to diffuse out from the workpiece to the mask, and to inhibit such loss, the mask preferably contains such alloying ingredients in addition to the titanium. The most preferred masking formulations thus contain about 43% by weight titanium powder plus an aluminum metal content equal to the aluminum content in the pre-alloyed workpiece, and in addition a content of other metals equal to about one-fifth their content in the pre-alloyed workpiece.

By way of example, for localized masking against the boronizing or aluminizing of Ti-6Al-4V, a very effective formulation is:

43% titanium
6% aluminum
0.8% vanadium
balance alumina

For similarly masking Ti-3Al-11Cr-13V, the preferred formulation is:

43% titanium
3% aluminum
2.2% chromium
2.6% vanadium
balance alumina

These highly effective formulations can have their ingredient percentages varied plus or minus about 10% without significantly detracting from their effectiveness. The formulations should also be broken in by a pre-heat to between about 750° to about 1000° C. for about 4 to about 15 hours with about ½ to about 1% activator added. Suitable activators are NH$_4$Cl and NH$_4$Br. A 980° C. pre-heat for 10 hours is preferred. The masking compositions can be applied to the workpieces as a slurry in a vaporizable liquid like water or methylchloroform, and the coated workpiece then packed in place in the pack of a coating retort before the coating dries and loosens. Alternatively a little binder such as poly(ethylmethacrylate) resin can be added to the masking composition as a 1 to 3% solution in methylchloroform, for example, to hold the masking coat in place during the coating heat. Where the heat is hot enough to drive off such resin binder and loosen the mask, non-fugitive binders such as bentonite can be used.

Aluminizing of titanium or any other substrate can be effected in very short times by specially heating a workpiece embedded in an activated powder pack, with a thermal input that brings it to diffusion coating temperature and completes the diffusion coating all in about 50 minutes or less. During this short interval the activator present in the pack begins to be volatilized at a relatively rapid rate that persists about 45 minutes, even if only present in the pack at a concentration of 0.5% by weight, and the formation of the diffusion coating case is extremely rapid. Thus, a 2 mil aluminized case is produced only about 30 minutes after starting to heat an iron or steel workpiece to 980° C. in a pack of:

| 10 parts by weight | Aluminum powder about 100 microns in size |
| 45 parts by weight | Chromium powder about 10 microns in size |
| 50 parts by weight | Al$_2$O$_3$ about 100 microns in size | with 0.5% NH$_4$Cl mixed in and based on the weight of the pack, if the workpiece reaches temperature in 15 minutes. The resulting aluminized case can have non-uniform thicknesses.

It is preferred to have the workpiece covered by no more than about ½ inch of activated pack when it is heated, inasmuch as the pack acts as thermal insulation and slows down the penetration of the heat to the workpiece from the walls of the retort in which it is held during the heating. With the workpiece embedded in a pack held in a cylindrical retort having a 7-inch length and a 2-inch diameter, so that about ½-inch pack thickness envelopes the workpiece, heat supplied at the rate of at least about 200,000 BTU per hour pound of workpiece will effect the desired heat-up to temperatures as high as 1000° C. During such heat-up the retort can have one or both its ends loosely covered to permit escape of gases, and can be held in a larger retort through which hydrogen or argon is flowed at a slow rate to flush out the escaping gases.

It is not necessary to arrange the workpiece so that it comes to within ¼ inch of the retort as described in U.S. Pat. No. 3,824,122. Indeed, the presence of a ½-inch thick pack covering is preferred when practicing the rapid diffusion coating of the present invention inasmuch as it assures the presence of sufficient energizer even when the energizer content of the pack is only 0.5% or less by weight. The energizer content can be increased, for example, to 1% or 2%, and where the workpiece contains a narrow passageway the wall of which is to be diffusion coated as in U.S. Pat. No. 4,347,267, the passageway can be filled or have its wall coated with a diluent-free mixture of activator and the metal to be coated on the wall.

A retort packed in accordance with the rapid diffusion coating technique of the present invention can contain a number of workpieces. There is no need to position each workpiece into its own carefully dimensioned closely fitting retort as in U.S. Pat. No. 3,824,122.

Diffusion coating packs in which the pack particles are very small, are particularly suited for diffusion coating the interiors of hollow articles. Some types of such interior coating are described in U.S. Pat. No. 3,936,539, and others in parent U.S. Pat. No. 4,347,267. The entire contents of the latter patent are hereby incorporated in the present specification as though fully set forth herein.

Of particular significance is the internal coating of hollow jet engine blades made of superalloys such as B-1900 or other nickel base superalloys, with the blades suspended in a retort having a layer of activated diffusion coating powder on the retort floor under the blades. Thus Example 4 of the '267 patent can be modified by not using the slurry for coating the interior of the blades there described, and instead vibrating into the cleaned and dried blade interiors a dry powder pack composed of, by weight

| 45% | chromium powder the particles of which are less than 20 microns in size |
| 10% | aluminum powder minus 200 mesh |
| 45% | calcined alumina minus 200 mesh | to which mixture ½% fine NH$_4$Cl powder is added. The resulting pack was pre-fired at 1950° F. for 10 hours, and then fresh NH$_4$Cl was added and the pack sifted through a 60-mesh screen to make sure no coarse particles are present. The material not passing through the screen was discarded.

The blades with the sifted pack filling their interiors are then mounted in one of the retorts illustrated in U.S. Pat. No. 4,347,267 and the retort floor covered with a ¾ inch thick layer of a chromium-containing aluminizing pack such as one consisting of, by weight, 45% chromium powder, 15% aluminum powder, and 40% alumina powder, activated with ½% ammonium chloride or ammonium fluoride or bifluoride, or a mixture of these. Alternatively the aluminizing pack on the floor and/or in the blade interior, can be a simple aluminizing pack such as one consisting of a correspondingly activated mixture, by weight, of 10% aluminum powder and 90% alumina powder.

The retort is first heated, with a hydrogen flush, to 1900°–1950° F. where it is held for 9 hours, after which the heating is terminated and the retorts cooled. The interiors of the cooled blades are cleaned out by blasts of high pressure air, leaving blades with about a 3 mil internal aluminized case of very good uniformity, and an external case of practically the same or slightly lesser thickness. The external case tends to be a bit thinner at those portions of the blade remote from the retort floor, as compared to the blade portions close to the floor.

The foregoing simultaneous internal and external coating technique is particularly suitable for workpieces having interiors accessible only through a passageway less than about 5 millimeters, or even less than about 2 millimeters wide. For passageways only about 0.1 millimeters wide, or narrower, the diffusion coating pack powder particles should be of extremely small size, as for example 10 to 20 microns. Using particles in the form of microspheres is also helpful, particularly in the smaller sizes, because such particles pour extremely readily. Other forms of pourable or fluent particles are also desirable.

Similarly effective diffusion coatings are formed with other superalloys, including cobalt-base superalloys, and even with other alloys and steels such as high-temperature steels. The layers on the retort floor can be any of those described in U.S. Pat. No. 4,347,267, and the packs loaded into the interiors of hollow blades or other hollow objects being coated, can also be selected from those that deposit the desired internal coating. Inasmuch as the objects being coated are not embedded in a pack, the labor involved is much reduced and heat-up and cool-down times also much reduced, as compared to the coatings described in U.S. Pat. No. 3,936,539.

A modified form of aluminum diffusion and leaching can also be used for applying coatings. In this modification there is first prepared an alloy of aluminum containing relatively small amounts of other metals to be coated onto a substrate. This pre-prepared alloy contains sufficient aluminum to bring its melting point down to 1800° F. or below, preferably 1400° F. or below. It can then be readily flame-sprayed on a workpiece, or the workpiece can be dip-coated in the molten alloy, and if desired the resulting coated workpiece heated in a protective atmosphere to improve the bonding. Where a protective atmosphere is used, it can be that of a diffusion coating activator like $NH_4Cl$ or $NH_4F$ or $NF_4HF_2$.

After the coating is completed, the coated workpiece is then dropped into a leaching bath that dissolves out most of the aluminum from the coating. Where some specific amount of aluminum is desired to be present in the coating after the leaching is completed, the leaching is terminated before the residual aluminum content drops too low.

After the completion of the leaching the workpiece has the desired coating, but the coating is in a microporous condition due to the voids introduced where the aluminum has been leached out. In such condition the coating is particularly receptive to receiving and anchoring top layers such as ceramic thermal barrier applied over jet engine vanes and blades.

A particularly desirable coating is the MCrAlY and MCrAlZr type coatings described in U.S. Pat. No. 4,005,989 and in the U.S. Department of Energy report DOE/NASA/259-26 NASA TM-81685 dated February 1981. Although these coatings contain only about 12 to about 15% aluminum by weight, a good aluminum-rich starting alloy for dip-coating or flame-spraying contains about 40 to 50% aluminum with the remaining alloying ingredients in the desired final proportions. About 3 hours of leaching in 20% aqueous NaOH at 140° F. subsequently removes essentially all the excess aluminum. The MCrAlY type coatings should not be leached too vigorously because the yttrium tends to be leached out by strong hot caustic.

After the leaching the leached products are rinsed and then top-coated with a mixture of extremely fine particles of $ZrO_2$ and $Y_2O_3$ as described in the above-cited Department of Energy report and the references cited therein. Such top-coatings generally have the $ZrO_2$ and $Y_2O_3$ in a molar ratio of from about 1:8 to about 1:12. Such mixtures can be slurried in water and the leached workpiece dipped in the slurry. The workpiece is now fired at about 2000° F. for a few minutes to secure the oxides in place, and the dipping and firing repeated to form an effective thermal barrier that can be about 5 to about 15 mils thick.

The "M" of the MCrAlY and MCrAlZr can be nickel, cobalt, iron or mixtures of any two or all three of these metals.

A thermal barrier is not needed when the diffusion coating is used for NOX removal and contains vanadium or other NOX-removing catalysts.

Other thermal barriers or top coatings can be substituted for or added to the $ZrO_2$ and $Y_2O_3$ mixtures, although ceramic barriers are preferred. Typical top coatings are shown in U.S. Pat. No. 4,260,654.

Any of these top coatings and thermal barriers can be applied over other porous undercoatings such as the porous nickel and platinum coatings described in U.S. Pat. No. 4,154,705. The nickel and platinum can themselves be applied as an alloy with aluminum or other selectively removable metal, and the selectively removable metal then removed as by leaching.

Alternatively a superalloy jet engine blade can be flame-sprayed with an aluminum-rich Al-Pt alloy, after which excess aluminum is leached out and the final porous surface heat-treated at a temperature high enough, e.g. 2000° F., in a diffusion atmosphere to cause the surface metal to diffuse into and thus fill the pores.

A further modification is the low-temperature diffusion of an aluminum coating into the surface of a substrate such as a superalloy jet engine blade, followed by leaching to render the aluminized surface porous, after which a solution of a thermally decomposable compound of a desired metal like platinum is absorbed into that porous surface and dried. The resulting material is now subjected to a diffusion treatment with or without an aluminizing pack, to liberate the platinum or other free metal, fill the pores, and blend the surface metals.

Cobalt also provides a suitable porous undercoat when applied and then rendered porous. While iron is quite similar in its characteristics, the leaching of iron-aluminum undercoating should be quite limited inasmuch as heavy leaching leaves the porous iron residue poorly adherent to the substrate. Platinum, nickel and cobalt give very good results when their porous stratum is from about ½ to about 2 to 3 mils thick, but porous iron provided in this way should not be over 1 to 2 mils thick. The aluminum alloy thickness on which the porous strata are formed should be about one or two mils thicker than the final porous layer.

The porous nickel, iron, platinum, cobalt and silver surfaces described in U.S. Pat. No. 3,637,437 can also be used to better anchor top coatings, whether applied to the substrates disclosed in that patent or on other metallic or non-metallic substrates.

The foregoing leaching can leave a product with a pyrophoric porous stratum that spontaneously reacts with oxygen in the air. The nickel, cobalt and iron is covered by an oxide film as a result of such reaction, but this oxide film does not completely block the pores over which it forms and does not interfere with the application of top coatings. Where the substrates carrying the undercoatings are extremely thin themselves, the reaction with oxygen can cause a substantial temperature rise, particularly in the case of porous nickel.

The foregoing porous undercoatings of platinum, nickel, cobalt, iron, and even silver can also be used to better anchor an MCrAlY or MCrAlZr top coating which can then be applied by the standard plasma coating technique, and if desired can also be further protected by an overlying thermal barrier layer.

As described in the parent applications, the pyrophoric action of pyrophoric members can be increased by placing in intimate contact with the member, a solid or liquid that undergoes an exothermic reaction when heated. Metals like magnesium and titanium, and even boron can thus be adhered to a pyrophoric foil as by placing a magnesium ribbon over an activated foil and passing the assembly between a pair of pressure rollers. Powdered materials such as magnesium, titanium, manganese, zirconium, carbon aluminum or boron can be dispersed in a volatile liquid and the dispersion applied to an activated member and dried. Commercially available boron powder is very effective when dispersed in an alcohol such as ethanol.

Such pyrophoric combinations need not be in the form of very thin coated foils, and can take other forms. Thus a 5-mil thick felt of boron or carbon fibers or ordinary paper or cotton cloth can be coated on one or both sides with a paste of pyrophorically activated iron or nickel powder, and the coated felt subjected to a drying and if desired a sintering treatment to form a self-supporting sheet in which the pyrophoric particles are embedded in the inter-fiber spaces. A boron felt weighing about 0.1 gram per square centimeter of gross surface (as measured with a ruler), carrying 0.2 gram pyrophoric iron powder per square centimeter of gross surface, generates a very large amount of heat when exposed to the atmosphere. Ordinary steel wool also makes a very effective porous substrate for impregnation.

The activated iron powder is readily prepared by activating the surface of an iron foil or sheet and scraping off the activated layer. Raney iron can also be used. Activated nickel powder can be prepared the same way but the scraping is much more difficult and it is accordingly preferred to use Raney nickel powder or to leach powdered $NiAl_3$ with alkali.

Instead of making a pyrophoric combination by starting with a sheet of felted fibers, the starting material can be a porous sheet or disc prepared as by a sintering operation so as to contain at least about 20% voids. The voids are then impregnated with pyrophoric or combustible particles as by merely applying to the sintered sheet or disc a slurry of the particles suspended in water or other volatile liquid. The presence of 1 to 5% resin binder in the liquid, based on the weight of the suspended particles, helps retain them in place after they are impregnated into the pores. Such particles are preferably about 1 mil or less in thickness, and the pores at least about 3 times the particles size. The porous sheet or disc can thus be sintered from particles at least about 10 mils in diameter so as to contain such large voids.

Alternatively the pyrophorically activated particles can be mixed with the non-pyrophoric combustible particles and the mixture thus sintered into the desired finished structure. In this modification powdered 100 mesh magnesium is for example mixed with one-half to twice its weight of minus 180 mesh pyrophoric iron or nickel powder, and the mixture first compacted under argon at 10,000 pounds per square inch into a disc about 5 mils thick, and then sintered at about 600° C. Only about 30 minutes at that temperature is sufficient. Higher temperatures can be used with other materials, but may cause excessive thermal deterioration of the pyrophoric particles and should be limited to shorter times.

Other particles such as of boron, zirconium and the like can be included in the mixture being sintered, even though these other particles do not significantly sinter together under the sintering conditions, so long as they are not in such large proportions as to prevent the sintering of the sinterable particles. For the greatest thermal output a high boron content is desired, at least 20% by weight, and some easily ignited metal such as magnesium, titanium or zirconium can be used to be more readily ignited by the pyrophoric particles. Because the non-pyrophoric particles act as heat sinks, the content of pyrophoric particles should be at least $\frac{1}{3}$ by weight in order to reach the necessary ignition temperature, at least in one portion of the sintered member. Pyrophoric nickel particles are somewhat more effective than pyrophoric iron particles in igniting non-pyrophoric particles.

The compacted and/or sintered mixtures can be made using pyrophoricity-developing particles that are not leached until the compacting and/or sintering is completed. Thus powdered aluminum and a powdered activatable metal in which the powders have a mesh size no larger than about 250 mesh and the atom proportion of aluminum to the other metal is from about $1\frac{1}{2}$ to about 3, then pressing and sintering a mass of the mixture at a temperature that causes the aluminum to react with the other metal to form a coherent mass, and then leaching out some of the reacted aluminum from the coherent mass to cause the mass to become pyrophoric.

The non-pyrophoric coating ignited by a pyrophoric substrate can be of the type that exothermally reacts in the absence of atmospheric oxygen. Thus the coating can be picric acid or a thermite mixture of finely divided aluminum and iron oxide powders, or ammonium dichromate, or gunpowder or a mixture of finely divided iron or boron with sodium nitrate or chlorate. Such a coating only about 1 or 2 mils thick on a pyrophorically activated iron or nickel foil about 2 mils thick, is ignited by the pyrophoric action when the coated foil is discharged into the thin air at altitudes of about 30,000 to 50,000 feet, and then generates supplemental heat more effectively than the pyrophoric action at those altitudes.

A little resin binder may be used to help hold such exothermic coatings in place, although soluble materials can be adherently deposited from solution in a vaporizable solvent such as methanol or water, and the solvent then vaporized off.

The foregoing exothermic coatings that react in the absence of atmospheric oxygen, can also be effectively applied to the above-discussed discs.

The sintered products can have their pyrophoricity blocked by the same coatings or atmospheres used to preserve pyrophoric foils. Moreover by combining two different types of coatings, enhanced blocking effects are obtainable. Thus dipping an activated iron or nickel foil in a 30% aqueous dispersion of colloidal silica, followed by removal and drying of the dipped foil, leaves a foil surface that more slowly generates pyrophoric heat. The heat dwell is made a few seconds longer and the peak temperature reached can be almost 100° F. lower. However when 10 to 90% of the silica in the dispersion is replaced by the triethanolamine chelate of dipropoxy titanium, the pyrophoricity-blocking effect is much more pronounced. The heat dwell can then be extended about 40% while the peak temperature drops a little over 200° F. A mixture of about 2 parts silica and about 3 parts chelate, is preferred.

The foregoing chelate has the formula

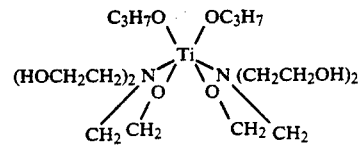

Triethanolamine, diethanolamine or monoethanolamine can be mixed with the colloidal silica to give effects similar to those of the chelate, and colloidal alumina can be correspondingly substituted for the colloidal silica, as can colloidally-sized, i.e. submicron-sized, particles of other inert solids.

The leaching after compacting and sintering to make pyrophoric masses, is particularly desirable for the making of masses such as discs or ribbons whose pyrophoric action is desired to have a long duration. This is illustrated in Example 4.

EXAMPLE 4

A mixture of carbonyl iron powder with an equal weight of fine aluminum powder is pressed together and sintered as described in U.S. Pat. No. 3,379,635 to form a disc about 50 mils thick. The disc is then leached with hot 30% NaOH solution overnight to yield a pyrophoric porous article which when exposed to air generates heat for about two minutes.

The maximum pyrophoric temperature developed at the disc's surface is only about 1400° F. but this temperature can be increased by impregnating the porous disc with material that is rendered exothermic by the pyrophoricity. Thus an aqueous suspension of micron-sized powdered zirconium can be poured on the porous disc to cause the fine zirconium particles to lodge within the disc's pores. On drying the pyrophoric heat generation ignites the zirconium so that the maximum temperature of the disc's surface goes well above 1400° F.

Powdered boron is a very effective heat generator but ignites at a temperature higher than zirconium does. Impregnation the foregoing porous disc with a mixture of 5 weight % zirconium and 5 weight % boron, based on the weight of the unimpregnated disc, yields a very effective pyrophoric combination however, in which both the zirconium and the boron burn upon exposing the impregnated disc to air.

A feature of the construction of Example 4 is that the pyrophoric product made, whether or not impregnated, is very inexpensive to prepare. The total cost of the ingredients is quite small, and the compacting and sintering steps are not expensive. No diffusion coating is needed and the sintering can be completed in as little as 30 minutes. An inert or reducing atmosphere is preferably used for the sintering.

EXAMPLE 5

A mixture of the following powders
6 parts by weight aluminum
4 parts by weight iron
1 part by weight copper, and
1 part by weight tin
is pressed in a 1¼ inch diameter mold with a plunger powered at 30 tons to make a disc about 15 to 20 mils thick. The disc is then removed from the mold and subjected to sintering at 1500° F. to provoke the reaction between the aluminum and the other metals. After subsequent cooling, the sintered disc is leached with 10% aqueous NaOH at 160° F. for 20 minutes, then rinsed and dried in argon. Blowing air 6 feet per minute at the dried disc causes pyrophoric reaction that carries the disc to 820° C. in less than one second and holds it above 750° C. for twelve seconds. This is a very strong response believed to be due to the manner in which the activated product is produced. A similar improvement in catalytic response is also noted.

The presence of the tin in the original powder mixture makes it unnecessary to have dissolved tin in the leach solution to improve the leaching action. About 5 to about 15 weight % tin content in the powders is preferred.

Nickel powder can be substituted for the iron powder in the compacts, but is preferably mixed with 1½ times its weight of aluminum powder. A 50-mil thick disc press-sintered from such a mixture and then leached 14 hours with hot 20% aqueous NaOH is more pyrophoric than the leached iron-aluminum disc of Example 4, but its pyrophoricity does not last as long. Such a leached nickel-aluminum disc can have its pores impregnated with inert particles such as the alumina and silica mentioned supra, to stretch out its pyrophoric heat output. On the other hand it can be impregnated with heat-generating materials to further accentuat its high heat output. It will for example ignite micron-sized boron particles without the need for the low-ignition-temperature zirconium.

The press-sintered masses can be made thicker or thinner than 50 mils. Making them 10 mils thick for example, makes them sufficiently light in weight so that they will fall through the air relatively slowly, particularly if the discs are 1½ inches or more in diameter. A group of such discs can then be discharged in the air to act as an effective decoy for heat-seeking missiles. Their effectiveness as a radar decoy is improved if the discs are given a plating of copper or silver on one or both faces. Not more than about 0.1 mil of such plating is needed. Electroplating is preferred over electroless plating.

The foregoing discs are somewhat friable, particularly when only about 20 mils thick or less. To provide a useful degree of ruggedness, such thin discs can have one face of unactivated metal that when sintered more securely holds the activated particles together. That face need only have a depth about 1/10 the total disc thickness. The following is an illustration.

EXAMPLE 6

In a square mold having a ½ inch by ½ inch cross section, there is first spread an 0.8 mil thick layer of minus 325 mesh iron powder. This is tamped down and then over it is poured a layer about 7.5 mils thick of a uniform mixture of the same size iron powder with an equal weight of minus 325 mesh aluminum powder. The combination is now subjected to pressing at 5 tons per square inch to form a coherent disc about 8 mils thick and ½ inch by ½ inch in outline. It has a face about 1/10 of its thickness, of only iron particles. That disc is easily pushed out of the mold without being damaged.

The disc is now placed on a ceramic plate and so held is passed through a tube furnace heated to about 600° C. After a few seconds the disc becomes heated red hot by the inter-reaction of the aluminum and the iron in its top layer. A protective stream of nitrogen or argon can be passed through the furnace tube to keep the disc from oxidizing. The disc is then pushed out of the heated part of the furnace and permitted to cool for a few more seconds.

The disc is at this point extremely rugged. It is now dropped into a 20% NaOH solution in water heated to about 80° C., to leach out much of the aluminum that has reacted with the iron. After about 30 minutes to several hours the leached disc is strongly pyrophoric, and can be removed under argon, washed and dried. It is still somewhat rugged and will easily withstand the handling needed to fully load a decoy shell with a quantity of the discs.

Instead of being square in outline, the discs can be rectangular or circular or have any other shape that permits them to be loaded with a minimum of unused space.

EXAMPLE 7

The process of example 6 is repeated but the final disc thickness is increased to about 12 mils, the aluminum to iron proportion is changed to 2.1, and the layer of inactive powder is placed in the center of the disc and is increased to about 1¼ mils. The final product has a layer of unreacted metal on both faces of which are sintered pyrophoric layers each a little less than 6 mils thick.

EXAMPLE 8

The process of Example 7 is repeated except that a 1 mil thick iron foil is substituted for the inactive layer, the aluminum to iron atom ratio is 2.5, and the pyrophoric layers are each about 5 mils thick.

EXAMPLE 9

Example 8 is repeated but the iron foil is replaced by a 60 by 60 iron wire screen woven from 2½ mil thick wire, the aluminum to iron atom ratio is changed to 1.9 and the overall disc is made 7 mils thick.

Perforated metal having other forms can be used in place of the wire gauze, and powdered nickel can be substituted for some or all of the powdered iron. The inert metal need not be identical to the powdered metal that is mixed with the aluminum. Copper-plated iron or nickel more effectively sinters to the active particles and can be effectively used.

The discs of Examples 5 through 9 are very good catalysts and can be used in the catalytic process mentioned hereinabove. For catalytic use it is generally safer to first eliminate the pyrophoricity, as by treatment with $H_2O_2$ and water as described in parent U.S. Pat. No. 4,443,557. An active platinum disc made by the press-sintering technique is also a very good catalyst after leaching, but eliminating its pyrophoricity is best effected by contacting it with dilute hydrochloric acid or other mineral acid. Catalytic platinum prepared this way has the added advantage that its content of contaminants such as carbon or iron can be kept extremely low. When preparing such catalytic platinum with an aluminum-diffusion step, the diffusion retort used to contain the diffusion materials tends to diffuse some of its constituents into the platinum. Carbon is thus frequently found in platinum that has been given a diffusion treatment in a steel retort. The use of a diffusion-coating retort made of nickel containing less than 0.1% carbon, does prevent such carbon contamination.

However the discs are particularly useful as decoy material for heat-seeking missiles. Their pyrophoric character and their compactness permit loading of the discs in a discharge shell for example, with very little waste space and somewhat greater pyrophoric material than the prior art pyrophoric foils.

Other metals, even copper brass and bronze, can be activated by the press-sintering technique. Not all such activated metals are pyrophoric, but they are all good catalysts. The thus-activated coppers, brasses and bronzes are quite effective in the alcohol synthesis of FIG. 1 for example. The chromium, molybdenum, manganese, vanadium, titanium, tungsten and tin alloy catalysts described above for denitration, are also effectively prepared by the press-sintering technique.

For some purposes it is desirable that the activated material be carried by wires. Thus a 3-mil thick nickel wire can be coated to a thickness of 10 mils with a suitable mixture of iron and aluminum powders held in place with a resin binder, and the coated wire then passed through a furnace to drive off the binder and cause the iron and aluminum powders to interact. The resulting aluminide-coated wire is then passed through a leach bath to dissolve out much of the aluminum.

The final wire with its activated coating can then be coiled up or wound on a form for catalytic use. For decoying heat-seeking missiles, the wire can be wound up into a tight coil and loaded into a discharge shell. Upon discharging the shell, the pyrophoric wire uncoils and pyrophorically reacts with the air to provide a decoy heat generator that does not scatter much.

Before loading, the wire can be passed between compacting rollers that give the coating a rectangular cross-section to thus make the coiling more compact.

Similar results are obtained when the wire carrier is replaced by a strip of 1 mil thick foil about one to two millimeters wide. In both cases the hot cloud developed by the decoys are only about 2 meters wide or less, and more effective in their decoy action. Cutting one radial slit from the coil center to its edge does not increase the cloud size significantly inasmuch as the cut lengths tend to entangle with each other as they unpeel. However the cutting eases the unpeeling.

The pyrophoric material can be held in a wire mesh bag that keeps it from expanding too much.

Decoy action is also improved by momentarily shutting down the engines in an airplane when its decoys are launched. Upon such shut-down, a heat-seeking missile will only have the decoys to lock onto.

Wider carriers can be used to carry the leached sintered aluminide powders and can be rolled into a coil to provide decoys which when loaded in and discharged from a cartridge shell will form a smaller (compacted) cloud decoy array more effective in decoying heat seeking missiles and other warheads. In this regard coil widths greater than about 35 millimeters appear to show delayed uncoiling when discharged and insufficient cloud density and heat output. The uncoiling action can be expedited by slicing a radial cut through the activated coil to thus provide a greater number of uncoiling ends.

The following are representative examples of the foregoing catalytic action:

EXAMPLE 10

A slurry dip coat consisting by weight of powdered 43.6% AL, 40.7% Fe, 14.7% Cu and 1% B in a binder solution containing an Acrylate resin dissolved in acetone or a chlorinated hydrocarbon such as methylchloroform, was applied to both surfaces of a 1 mil thick steel foil or ½ mil stainless steel foil in a continuous coil coating process. The width of the foil in both cases was about ½ inch. After emerging from the dip bath which was kept in continuous agitation, the strip was force dried by radiant heat to remove the solvent and set up the coating so that it was adequately attached to the foil surface. The coated foil was next passed through a furnace containing an inert or reducing atmosphere at 1500°–1800° F. In about 10 to 20 seconds this exposure caused an exothermic reaction between the Al and other metals to form aluminides with minor but definite diffusion into the steel and stainless steel foil substrate to give excellent bonding to the substrates. The strip while still hot was passed through a set of hardened steel rolls to compress the aluminide coating. The coating was then leached by passing the foil in a continuous fashion through an aqueous solution containing 10% NaOH and 0.05% Sn at 140°-200° F.

The activated strip was then washed in water, heated to dry it and drive off occluded $H_2$ in an inert atmosphere and recoiled for insertion as ½ inch width coils into an appropriate cartridge shell. The final thickness of each coated foil was about 6 mils for the steel foil and 3.5 mils for the stainless steel foil.

EXAMPLE 11

A mixture of powdered aluminum and powdered nickel in equal parts by weight, when subjected to the above treatments, makes a very effective cathode electrode for electrolyzing aqueous KOH to generate hydrogen using a very low over-voltage.

Aluminum-to-nickel weight proportions can vary from 60:40 to 40:60 to give best results.

EXAMPLE 12

For NOX reduction with the help of NH as described supra, a catalyst formed as above from a mixture of powdered:

| | |
|---|---|
| chromium | 17 parts by weight |
| iron | 83 parts by weight |
| aluminum | 100 parts by weight | is very effective. A plain steel foil or gauze can be substituted for the more expensive screens to reduce manufacturing costs. The presence of more than 10 parts chromium for every 90 parts iron moderates the aluminide-forming reaction sufficiently to keep it from seriously degrading the plain steel foil.

EXAMPLE 13

For the above-described conversion of carbon monoxide to alcohols, a very effective catalyst is made as noted using a powdered mixture of equal parts copper and aluminum. Here however the leaching is preferably effected with 3% nitric acid or aqueous ammonium persulfate at room temperature, and terminated before the catalyst shows a copper color.

Similarly effective is the catalyst prepared the same way from a powdered mixture of, by weight:

| | |
|---|---|
| 40 parts | copper |
| 10 parts | zinc |
| 50 parts | aluminum |

EXAMPLE 14

Powdered platinum and palladium can be aluminized by themselves and converted to catalysts as in Example 9 for use wherever these metals are used, as in CO oxidation, HCN synthesis and ammonium cyanate production.

A feature of the catalysts of Examples 9 through 12 is that they are very inexpensive to prepare.

Activation by diffusion coating has the advantage of being readily confined by masking, to specific areas of a substrate. This is illustrated in detail in the parent cases such as U.S. Pat. No. 4,464,430, and can be effected with the diffusion coating of platinum on superalloy airfoils of jet engines. Thus as shown in U.S. Pat. No. 4,041,196, platinum plating on the airfoil surface of nickel-base superalloy blades for the hot section of a jet engine, improves the life of the blades, particularly when the platinum plated airfoils are then given a diffusion aluminizing or chromaluminizing. The above-noted MCrAlY and MCrAlZr coatings also greatly improve such life. By masking the roots of the blades, these coatings can be kept from the roots, where they are not needed and where they can increase dimensions out of tolerance.

Some blades however are made of hafnium-containing superalloy, for example Rene 80, and do not accept aluminum or MCrAlY or MCrAlZr coatings well unless the surface being aluminized is treated to deplete its hafnium content. To this end the blades can be given a heat treatment with their airfoil surfaces packed in a mixture of powdered nickel and inert refractory diluent like alumina. Only about 10% nickel by weight in such a pack will be enough to adequately deplete the airfoil surface at 1200° F. for about one hour in a diffusion coating atmosphere such as one provided by the decomposition of $NH_4Cl$ or other diffusion coating energizer.

The foregoing depletion can be quite pervasive, and is undesirable if it extends to the blade root where maximum strength is needed. The root is accordingly packed in a separate masking mixture such as the high-chromium masking powders of parent U.S. Pat. No. 3,801,357. A typical formulation for this purpose is a mixture of powdered $Ni_3Al$ with powdered chromium and powdered inert refractory diluent, in which the chromium content is about 3 to about 10 weight %, and the diluent content is about ¼ to about ⅔ by weight. The $Ni_3Al$ can be replaced by nickel aluminides having more than one-third and up to three-fourths atom of aluminum for every atom of nickel. The chromium content should be not over 15%, and the nickel aluminides can be omitted.

The temperatures at which such masking is effective are the same temperatures at which the airfoil depletion is effected, and can vary from about 1000° F. to about 2000° F. Inasmuch as very little depletion is needed, the depletion treatment is preferably kept short—not longer than about 2 hours at the masking temperature. Even ½ hour of depletion treatment improves subsequent coatings including aluminizing whether of the complex kind that uses a pack containing both chromium and aluminum powders or the simple pack treatment in which there is no significant amount of chromium in the pack, or whether the aluminizing is conducted in the gas phase as described in U.S. Pat. No. 4,347,267. Apparatus suitable for the masking of the present invention is shown in U.S. Pat. No. 3,801,317.

The Rene 80 alloy is a nickel-base superalloy, and cobalt-base superalloys can also contain hafnium and require surface depletion. The depletion treatment for cobalt-base superalloys can be exactly the same as for nickel-base alloys, including the use of the above-noted root-masking technique. However for the cobalt-base superalloys, cobalt aluminides can also be substituted for the corresponding nickel aluminides in the root-masking compositions. The root-masking compositions can also contain a very small amount of hafnium—about ¼ to ½% by weight—to improve their masking effects.

MCrAlY and MCrAlZr coatings are generally applied by holding the workpieces in an evacuated chamber into which the coating ingredients are plasma sprayed. It is accordingly helpful to have the workpieces pre-masked as by embedding the portion to be masked—the root of a jet engine blade for example—in a masking powder, or by applying to that portion an adherent masking mixture. A very effective masking for this purpose is made of two superposed coating layers, the lower layer being a nickel aluminide layer as described in U.S. Pat. No. 3,801,357, and the upper layer being a thin coat of powdered nickel with or without a little powdered aluminum. The aluminide of the lower layer has less than one atom of aluminum for each atom of nickel, and can also contain a little chromium as described in U.S. Pat. No. 3,801,357. The aluminum powder in the upper layer should provide not more than one atom of aluminum for every three atoms of nickel in the upper layer.

The lower layer preferably has a thickness of about two to 10 mils, and the upper layer about 3 to 8 mils. In such a masking combination the lower layer prevents depletion from the workpiece portion it covers, and the upper layer forms an adherent protective sheath as the plasma spray operation starts, thus anchoring both layers in place during the entire MCrAlY or MCrAlZr coating sequence. A little inert refractory powder such as alumina or mixed iron-zirconium-silicon oxides, can be mixed with the nickel powder of the upper layer, preferably not over 10% by weight of the nickel.

The radiation effectiveness of any of the pyrotechnic webs for decoy use can be substantially improved by adherently coating their surfaces with a layer about 20 to about 500 microns thick of finely divided alumina, silica or zirconia, or mixtures of any two or all three in any proportions. Thus, a 0.4 millimeter-thick web of woven carbon fiber cloth pre-treated with 0.2 molar lead acetate and impregnated with 1% to 10% activated iron powder, is immersed into a 2.5% by weight solution of poly (ethyl acrylate) resin in methylethylketone, then the impregnated cloth is withdrawn from the resin solution, dried for a few seconds and dropped into a container having a quantity of 325-mesh zirconia. The container is shaken in order to get the zirconia particles spread over the cloth, after which the coated cloth is removed and dried. When the dried product is exposed to air, the particles of activated iron ignite and ignite the carbon which then burns and the incandescence thus produced has a high concentration of radiation in the 8-to-14-micron wave length of the spectrum. A somewhat better concentration is obtained when half the zirconia is replaced by alumina.

Silica and/or silicon carbide particles can be used in place of or in mixtures with the zirconia and/or alumina.

The particles can be applied to the carbon cloth web by spraying on it a slurry of the particles in the resin solution. It is preferred that the slurry contain a high concentration of the particles, about 10 to 50 times the weight of the resin.

A preferred technique is to take a flat carbon fiber cloth about 0.5 millimeter thick and pre-dipped as noted above in aqueous lead acetate and then dried, coat one of its faces with a spray of 90 parts by weight of a 1:1 mixture of 325-mesh $ZrO_2$ and $Al_2O_3$ slurried in 100 parts by weight of a 2 weight percent solution of poly (methylmethacrylate) in acetone. The coating is built up to a thickness of about ¼ millimeter, and then permitted to dry. On the opposite face of the cloth there is sprayed on, in an argon atmosphere, about a 70 micron-thick slurry of activated iron powder particles about 10 microns in size, in twice its weight of a 3 weight percent solution of poly (ethyl acrylate) in acetone. This coating can be as much as 300 microns in thickness.

The second coating is dried in the argon atmosphere and still in that atmosphere is given a top coating of the $ZrO_2$-$Al_2O_3$-binder slurry, about ½ the thickness of the original $ZrO_2$-$Al_2O_3$-binder coating, and again the coated cloth is dried in the argon atmosphere. One or more of such coated cloths can be sealed in a plastic bag or decoy shell and will keep until needed for decoy use. At that time, the cloths are exposed to air and will spontaneously ignite. They show a very good thermal radiation in the 8-to-14 micron band. The face carrying the thicker $ZrO_2$-$Al_2O_3$-binder coat shows stronger radiation in that band than the face carrying the thinner such coat.

Solutions of other tacky resins such as other acrylic resins, polyvinylacetate, polyurethanes and pressure-sensitive resin formulations can be used in place of the noted poly acrylates. Suspensions of resins in liquids in which they do not dissolve are not particularly effective.

Where an aluminum alkyl is used for ignition in place of the activated iron, the adhesive resin should not be one in which the alkyl dissolves.

Activated iron or nickel particles, when used, can be applied to the carbon cloth by the techniques described for the zirconia, or the resin-to-activated-powder ratio can be diminished and even reduced to zero. Thus, a resin-free slurry of very finely divided activated powder in water can be sprayed onto one or both faces of the carbon cloth to deposit about 1/50 to about 1/10 gram of the activated powder per square centimeter of cloth surface. After a little drying in argon, there is then sprayed over both faces of the particle-carrying cloth, a slurry of zirconia powder. The binder in the zirconia slurry then holds the activated powder particles in place, and such a coating not over about 100 microns thick does not prevent their pyrophoric reaction when the coated cloth is exposed to air.

The pyrophoric metal foils of the present invention are preferably prepared in large quantities by the use of the open-coil activating technique described in U.S. Pat. No. 4,443,557. A number of individual activating retorts can thus be loaded with an open coil of iron foil, and with the mixture of 20% powdered aluminum and 80% powdered alumina, along with about ½% to about 1% of $AlCl_3$ or $CrCl_3$ activator. The individual retorts so loaded are moved through a furnace as described in connection with FIG. 4 of U.S. Pat. No. 3,903,338, so the contents of each retort reach about 1200° F. for about ½ to about 1 hour. Better results are obtained at lower temperatures and longer times, as for example, 900° F. for 16 hours.

After cooling, the aluminized foil is reacted with aqueous caustic containing dissolved tin as described in the parent applications to leach out some of the aluminum which had diffused into the foil.

Alternatively, the foil can be activated by continuous reeling of a long length through a retort as shown in U.S. Pat. No. 4,435,481. As there described, the activation can be effected on one or both faces of the foil. The mixture of powdered aluminum and powdered alumina should have at least 40% alumina by weight, inasmuch as smaller proportions of alumina will permit some of the powdered aluminum, which melts during the treatment, to wet the foil. This is undesirable inasmuch as it blocks the activated diffusion of the aluminum into the iron. Such activated diffusion brings much more desirable results than diffusion from a melt coating.

The Raney activated iron and nickel or alloys of these two as well as cobalt can have their heat generation and high-temperature dwell increased by subjecting them to a very short treatment in dilute acid. An aqueous or non-aqueous solution of inorganic or organic acid having a pH of about 1 to about 4, preferably about 1.5 to 3.5 is effective, and stronger acidities are not as effective. The dip need only be about ½ minute long after gasing starts, but longer dips do not significantly detract from the effects unless the acid used is a strong mineral acid.

A 5-minute dip in 1% to 10% citric acid in water of freshly activated 4-mil thick iron foil, the leaching of which was effected in the presence of tin, increases its maximum pyrophoric temperature by about 50° F., and increases the dwell at or above 1200° F. from about one second to about three seconds. The dwell at or above 1150° F. is increased from about 1.6 seconds to about 4.5 seconds, and the dwell at or about 1100° F. from about 3 seconds to about 5 seconds.

A corresponding dip in 1% to 10% aqueous succinic acid produces about the same results, and similar acetic acid treatment effects only slightly smaller increases. Hydrochloric acid at 7% concentration in water is not quite as effective as 10% aqueous acetic acid. Other acids that can be used are chloracetic acid, formic acid, lactic acid, maleic acid, malonic acid, p-nitro benzoic acid, phosphoric acid, picric acid, salicylic acid, sulfuric acid and tartaric acid. Any acid capable of supplying a pH of between 1.5 and 4 is appropriate. However, acids like nitric acid attack the substrate very rapidly and contact with such acids should be held down to about ¼ minute.

The acids can be dissolved in lower monohydric alcohols such as methanol, ethanol or isopropanol or in mixtures of such an alcohol with water, and still provide the increase in maximum pyrophoric temperature and high temperature dwell. Organic acids are preferred, particularly the polycarboxylic acids.

The dips can be effected at any temperature from about 20° F. to about 210° F., but ordinary room temperatures of about 60° F. to 90° F. are easiest to use. Pyrophorically activated nickel foil also shows corresponding improvements in maximum pyrophoric temperature and high-temperature dwell, as do activated iron and nickel screens. Such improvements of activated iron is obtained whether or not tin is used during its leaching.

Combining the acid dip with the folding of FIG. 5 provides still greater increases in dwell.

Such increases are particularly desirable in the use of the activated materials as decoys for heat-seeking missiles. For such use, the Raney-activated and acid-treated metal is preferably a foil between about 2 and about 6 mils thick. The folding increases the foregoing high-temperature dwells at least an additional 60%.

The activated metal foils can also be coated with a binder-containing slurry of the $ZrO_2$, $Al_2O_3$ or other material that concentrates pyrophoric radiation in the 8-to-14 micron range. Again, the slurry should contain solid particles in an amount from about 10 to about 50 times the weight of the binder, and the coating should not be over about 100 microns thick on at least one face of the foil.

Carbon and graphite articles can also be diffusion coated to protect them at high temperatures. Thus, as described on pages 64–68 in the November 1986 issue of Advanced Materials & Processes, carbon-carbon composites made by pyrolytically depositing graphite in a cloth woven from graphite fibers can be used to make parts such as re-entry nose cone shields, wing leading edges and rocket nozzles for space shuttles, but need protection against oxidation. According to the present invention these carbon-carbon composites are diffusion coated with hafnium, titanium, boron or other material that forms a carbide resistant to temperatures as high as 3000° C. Ordinary pack diffusion in a pack containing about 5% to about 20% of the hafnium or other diffusing material, the balance powdered inert diluent such as $Al_2O_3$, yields an effective diffusion at 1800° F. to 2100° F. for three to twenty hours under hydrogen or inert atmospheres, and the outermost carbon skin is thus converted to the carbide of the diffusing material. One-fourth to one percent of the usual ammonium chloride activator can be used as well as of other ammonium halides and free halogens or hydrogen halides. Chromium chloride and other metal chlorides can also be used but they deposit their metals in the diffusion coating and this may or may not be desired. Hafnium halides or double halides with alkali metals are suitable activators, as are alkali metal fluoborates.

Many modifications and variations of the present invention are possible in the light of the above teachings. It is, therefore, to be understood that within the scope of the appended claims the invention may be practiced otherwise than as specifically described.

I claim:

1. A porous metal aluminide catalyst formed by sintering together a mixture of aluminum powder with a powdered pyrophorically-activatable metal in the proportion of about 1½ to 3 atoms of aluminum for every atom of the activatable metal, to cause the metals to inter-react and form a coherent mass, then leaching aluminum out of the mass to render it pyrophoric, and then destroying that pyrophoricity.

2. The combination of claim 1 in which the catalyst is formed on a carrier support.

3. The combination of claim 1 in which the metal aluminide is nickel aluminide.

4. The combination of claim 1 in which the metal aluminide is iron aluminide.

5. The combination of claim 1 in which the activatable metal is a denitration metal.

6. The product produced by the process of claim 1.

* * * * *

UNITED STATES PATENT AND TRADEMARK OFFICE
CERTIFICATE OF CORRECTION

PATENT NO. : 5,077,257
DATED : December 31, 1991
INVENTOR(S) : Alfonso L. Baldi

It is certified that error appears in the above-identified patent and that said Letters Patent is hereby corrected as shown below:

Column 5, line 22, change "NaOii" to -- NaOH --

Signed and Sealed this

Twenty-second Day of June, 1993

Attest:

MICHAEL K. KIRK

Attesting Officer     Acting Commissioner of Patents and Trademarks